(12) United States Patent
Wang et al.

(10) Patent No.: US 9,281,246 B2
(45) Date of Patent: Mar. 8, 2016

(54) STRAIN ADJUSTMENT IN THE FORMATION OF MOS DEVICES

(75) Inventors: Yi-Wen Wang, Kaohsiung (TW); Jen-Pan Wang, Tainan (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 13/551,413

(22) Filed: Jul. 17, 2012

(65) Prior Publication Data

US 2014/0021552 A1 Jan. 23, 2014

(51) Int. Cl.
*H01L 21/338* (2006.01)
*H01L 21/8238* (2006.01)
*H01L 29/78* (2006.01)
*H01L 29/66* (2006.01)

(52) U.S. Cl.
CPC .... *H01L 21/823807* (2013.01); *H01L 29/6653* (2013.01); *H01L 29/6659* (2013.01); *H01L 29/7843* (2013.01); *H01L 29/665* (2013.01)

(58) Field of Classification Search
CPC ............... H01L 21/2815; H01L 21/823468; H01L 21/823864; H01L 29/6653; H01L 21/823807; H01L 29/6659; H01L 29/7843; H01L 29/665

USPC ............ 257/368, E27.06, 288, 369; 438/197, 438/151, 199, 184, 230, 303
See application file for complete search history.

(56) References Cited

U.S. PATENT DOCUMENTS

| | | | | |
|---|---|---|---|---|
| 2007/0020866 | A1* | 1/2007 | Cheng | H01L 21/823814 438/301 |
| 2010/0022061 | A1* | 1/2010 | Wu | H01L 21/823468 438/301 |
| 2011/0171810 | A1* | 7/2011 | Tseng | H01L 28/20 438/382 |
| 2011/0223732 | A1* | 9/2011 | Griebenow | H01L 21/26513 438/275 |
| 2012/0056245 | A1* | 3/2012 | Kang | H01L 21/0245 257/192 |
| 2013/0193521 | A1* | 8/2013 | Lee | G11C 11/412 257/369 |

* cited by examiner

*Primary Examiner* — Jarrett Stark
*Assistant Examiner* — Shahed Ahmed
(74) *Attorney, Agent, or Firm* — Slater & Matsil, L.L.P.

(57) ABSTRACT

A method includes forming a gate stack over a semiconductor substrate, and forming a gate spacer on a sidewall of the gate stack. After the step of forming the gate spacer, the gate spacer is etched to reduce a thickness of the gate spacer. A strained layer is then formed. The strained layer includes a portion on an outer sidewall of the gate spacer, and a portion over the gate stack.

19 Claims, 9 Drawing Sheets

STRAIN ADJUSTMENT IN THE FORMATION OF MOS DEVICES

BACKGROUND

The scaling of VLSI circuits is a constant effort. Smaller integrated circuits allow for more devices to be formed in one semiconductor chip. Additionally, the power consumption and the performance of the devices are also improved. With the circuits becoming smaller and faster, the improvement in device driving current is becoming more important, which device driving current can be increased by improving carrier mobility. Among efforts made to enhance carrier mobility, forming a stressed channel region is a known practice. The performance of a Metal-Oxide-Semiconductor (MOS) device can be enhanced through increasing the stress in the respective channel. This technique allows for the performance of the MOS device to be improved without adding complexity to circuit fabrication or design.

Research has revealed that a bi-axial, in-plane tensile stress can improve N-type MOS (NMOS) performance, and a compressive stress parallel to the channel length direction can improve P-type MOS (PMOS) device performance. A commonly used method for applying stress to the channel region is forming a stressed Contact Etch Stop Layer (CESL) on a MOS device. The stressed CESL applies a stress into the channel region. Therefore, the carrier mobility in the channel region is improved.

Since NMOS devices prefer tensile stresses in their channel regions, and PMOS devices prefer compressive stresses, tensile CESLs may be formed on the NMOS devices, and compressive CESLs may be formed on the PMOS devices. The stresses applied on each of the PMOS devices and NMOS devices are thus affected by the magnitude of the inherent stresses of the respective overlying CESLs.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

Metal-Oxide-Semiconductor (MOS) devices and the method of forming the same are provided in accordance with various exemplary embodiments. The intermediate stages of forming the MOS devices are illustrated. The variations of the embodiments are discussed. Throughout the various views and illustrative embodiments, like reference numbers are used to designate like elements. I the discussed embodiments, device regions 100 and 200 are an NMOS region and a PMOS region, respectively. The teaching of the embodiments, however, may also be applied when devices regions 100 and 200 are NMOS regions or PMOS regions. Similarly, device regions 300 and 400 may also be NMOS regions or PMOS regions.

Figure 1:
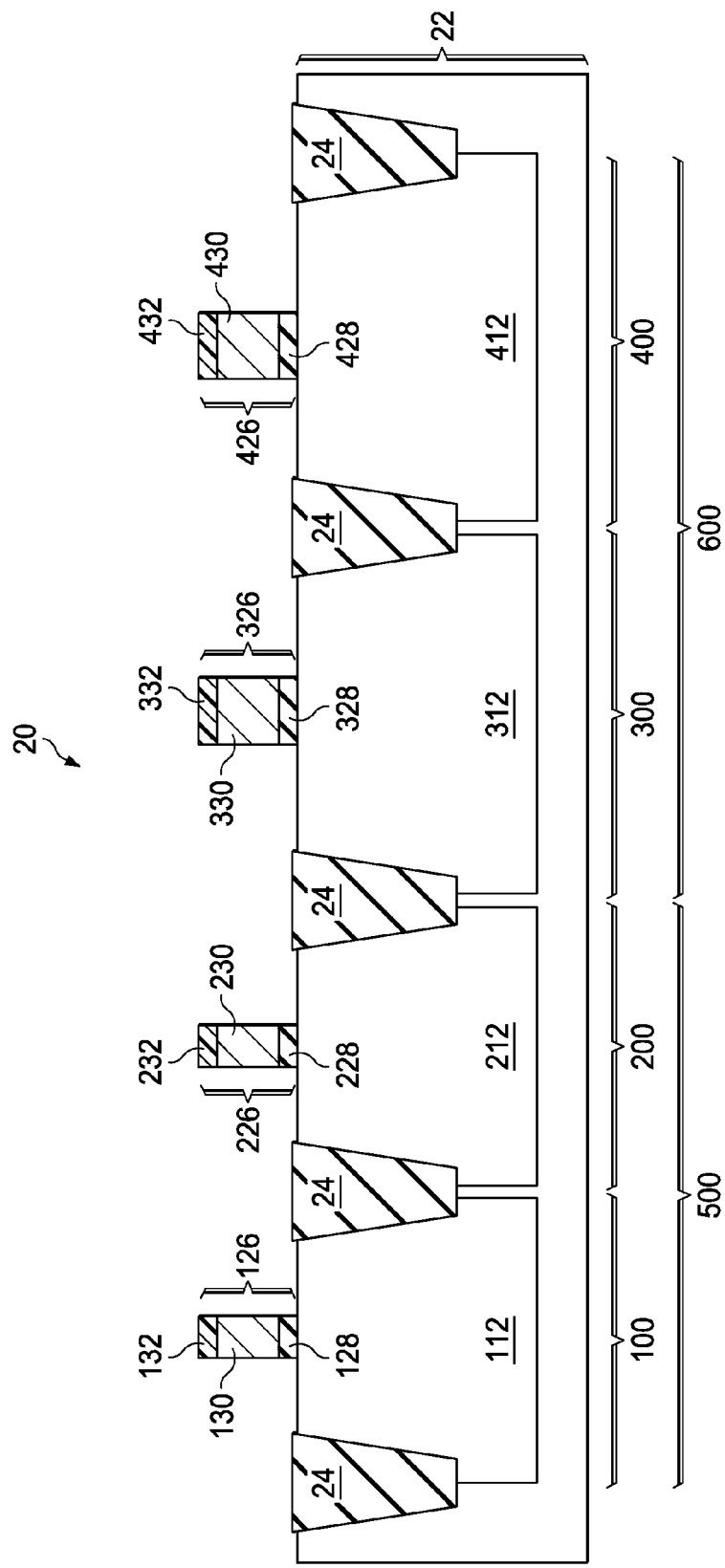
FIGS. 1 through 8 are cross-sectional views of intermediate stages in the manufacturing of Metal-Oxide-Semiconductor (MOS) devices in accordance with some exemplary embodiments.

Referring to FIG. 1, wafer 20 is provided, which includes semiconductor substrate 22 therein. Semiconductor substrate 22 may be a silicon substrate, a SiGe substrate, a III-V compound semiconductor substrate, or the like. Furthermore, semiconductor substrate 22 may be a bulk substrate or a Semiconductor-On-Insulator (SOI) substrate. Semiconductor substrate 22 includes portions in device regions 500 and 600. Insulation regions 24, which may be Shallow-Trench-Isolation (STI) regions, are formed in semiconductor substrate 22, and may be used to define active regions that are used to form MOS devices. In some embodiments, each of device regions 500 and 600 may be a core device region, a memory device region, or an Input/Output (IO) device region, or another type of device region, depending on the type of the MOS devices formed in device regions 500 and 600. Device regions 500 and 600 may be the same type of device regions, or different types of device regions. For example, when the MOS devices formed in device region 500 are core MOS devices, device region 500 is a core device region. Alternatively, device region 500 is a core device region if the MOS devices formed in device region 500 is TO MOS devices. Device region 500 further includes NMOS device region 100 and PMOS device region 200, in which an NMOS device and a PMOS device, respectively, are to be formed. Device region 600 further includes NMOS region 300 and PMOS region 400, in which an NMOS device and a PMOS device, respectively, are to be formed. P-well regions 112 and 312 and n-well regions 212 and 412 may be formed in substrate 22 in accordance with some embodiments.

Gate stacks 126, 226, 326, and 426 are formed in device regions 100, 200, 300, and 400, respectively, and over semiconductor substrate 22. Gate stacks 126 and 226 may be neighbors of each other, with no additional gate stacks therebetween. Gate stacks 326 and 426 may be neighbors of each other, with no additional gate stacks therebetween. Gate stack 126 includes gate dielectric 128, gate electrode 130 over gate dielectric 128, and hard mask 132 over gate electrode 130. Gate stack 226 includes gate dielectric 228, gate electrode 230 over gate dielectric 228, and hard mask 232 over gate electrode 230. Gate stack 326 includes gate dielectric 328, gate electrode 330 over gate dielectric 328, and hard mask 332 over gate electrode 330. Gate stack 426 includes gate dielectric 428, gate electrode 430 over gate dielectric 428, and hard mask 432 over gate electrode 430. Gate dielectrics 128, 228, 328, and 428 may comprise silicon oxide, silicon nitride, or materials having high dielectric constants (k values), for example, with k values greater than 7.0. Gate electrodes 130, 230, 330, and 430 may comprise polysilicon, metals, metal nitrides, metal silicides, and/or the like. Hard masks 132, 232, 332, and 432 may comprise silicon nitride, for example.

Figure 2:
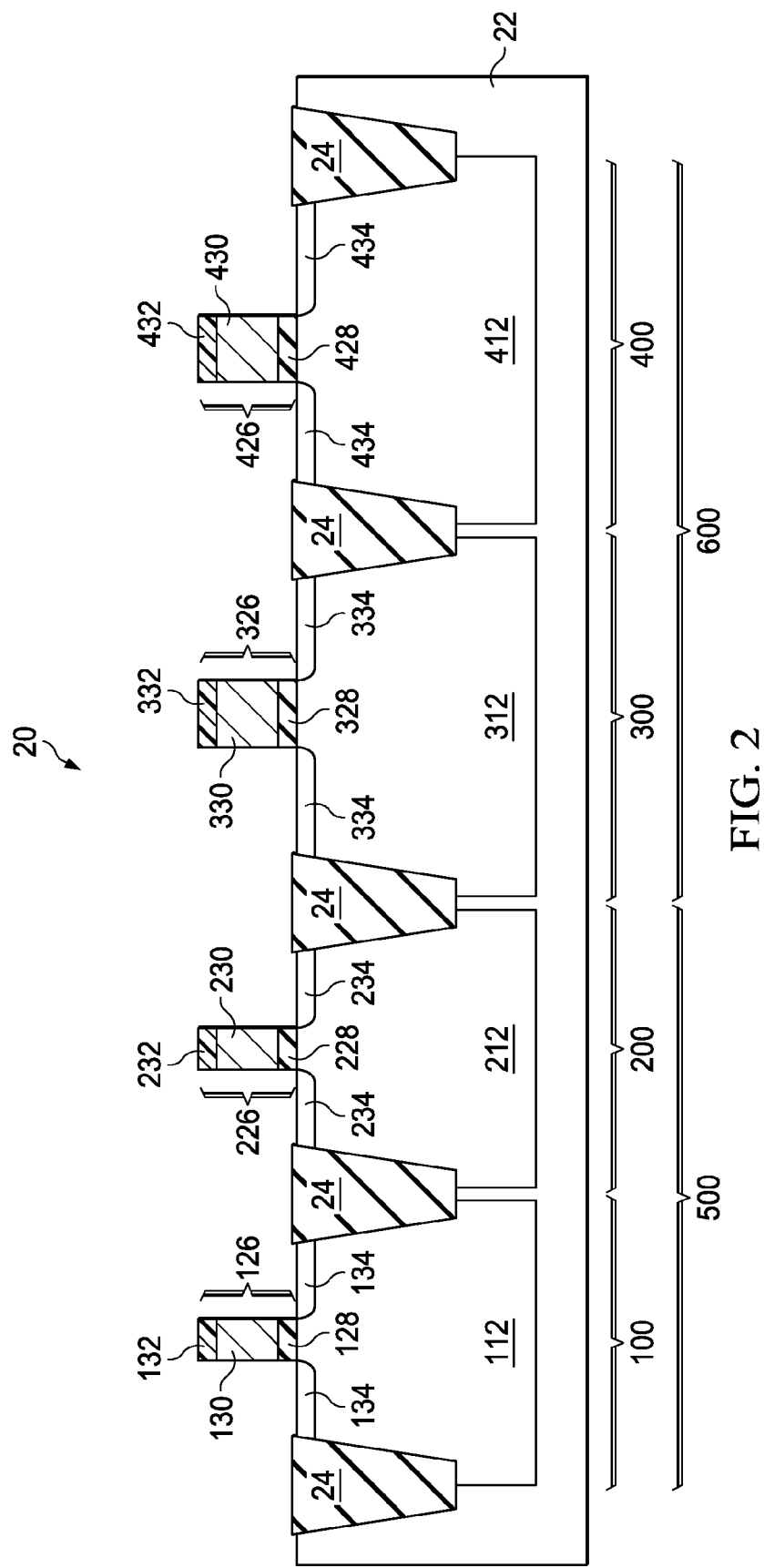

Next, referring to FIG. 2, Lightly Doped Drain/source (LDD) regions 134, 234, 334, and 434 are formed. Although not shown in FIG. 2, the formation of LDD regions 134, 234, 334, and 434 may include a plurality of implantation steps. For example, when device regions 500 and 600 are a core device region and an IO device region, respectively, the process step for forming each of LDD regions 134, 234, 334, and 434 may be separated from the formation of other ones of LDD regions 134, 234, 334, and 434, so that the formation of each of LDD regions 134, 234, 334, and 434 is customized, and the device performance of the respective MOS devices may be tuned as a result of the customized formation steps. The formation of LDD regions 134, 234, 334, and 434 includes implantations. For example, when forming LDD regions 134, a photoresist (not shown) is formed to cover device regions 200, 300, and 400, and then an n-type impurity such as phosphorous or arsenic is implanted into the portion of substrate 22 in device region 100. LDD regions 134 and 334 are n-type regions, and LDD region 234 and 434 are p-type regions. Furthermore, in some embodiments, an oxide layer (such as a silicon oxide layer) may be formed to cover the top surface of substrate 22 and gate stacks 126, 226, 326, and 426, and the implanted impurities penetrate through the oxide layer to form LDD regions 134, 234, 334, and 434.

Figure 3:
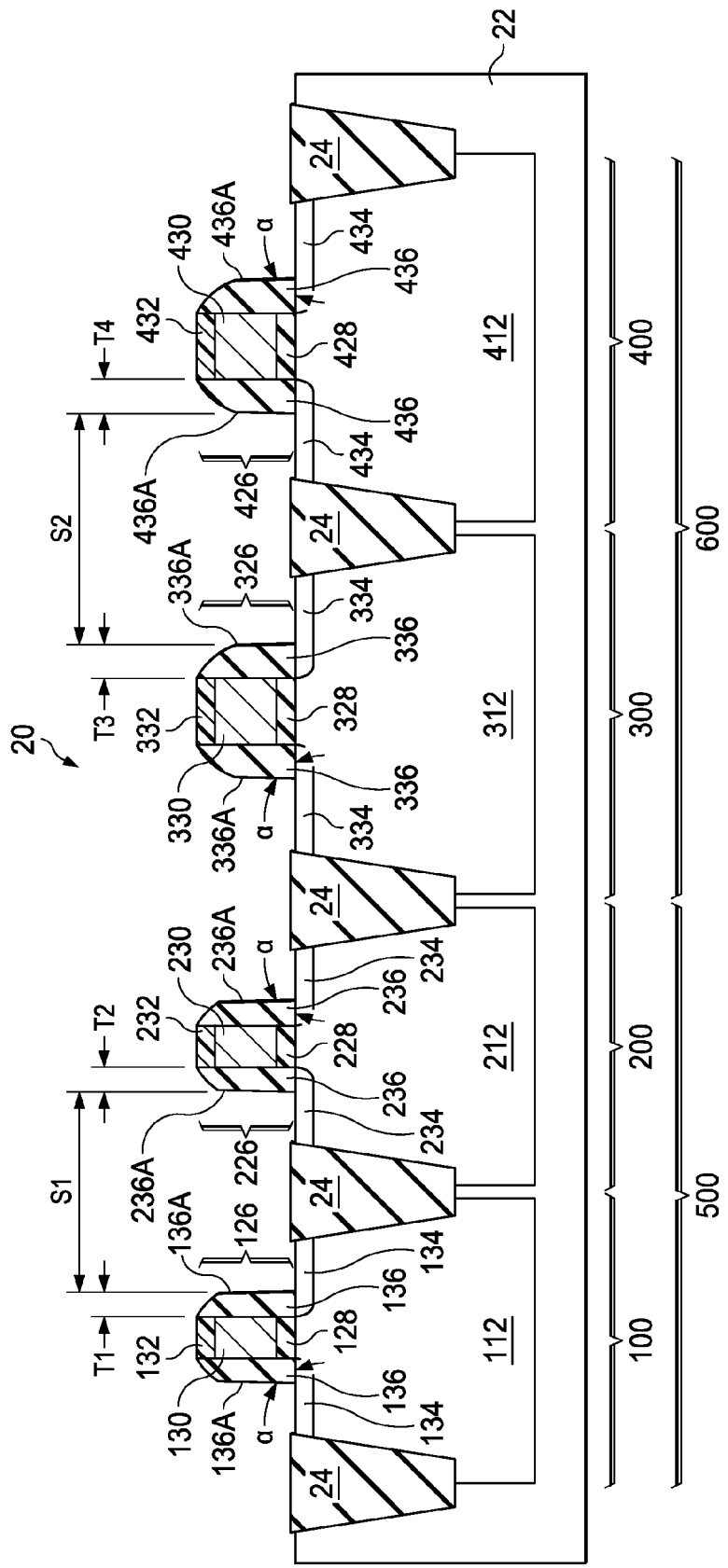

FIG. 3 illustrates the formation of gate spacers 136, 236, 336, and 436. In some exemplary embodiments, the formation process includes depositing blanket dielectric layers, and then patterning the blanket dielectric layers. The horizontal portions of the blanket dielectric layers are removed in the patterning step, and the vertical portions on the sidewalls of gate stacks 126, 226, 326, and 426 are left to form gate spacers 136, 236, 336, and 436, which have thickness T1, T2, T3, and T4, respectively. Thicknesses T1, T2, T3, and T4 may be equal to each other. The etching of the blanket dielectric layers may be performed without using photo resists or other types of masks as etching masks. The etching of the blanket dielectric layers may be an anisotropic etching, which may be a dry etching. In some exemplary embodiments, each of gate spacers 136, 236, 336, and 436 includes a silicon oxide layer and a silicon nitride layer over the silicon oxide layer. In other embodiments, gate spacers 136, 236, 336, and 436 comprise nitrides, oxynitrides, oxides, and combinations thereof. The formation methods may include Plasma Enhanced Chemical Vapor Deposition (PECVD), Low Pressure Chemical Vapor Deposition (LPCVD), Rapid Thermal Chemical Vapor Deposition (RTCVD), Atomic Layer Deposition (ALD), and the like. Due to process reasons, outer sidewalls 136A, 236A, 336A, and 436A are slanted, wherein the tilt angle α is smaller than 85 degrees, and may be smaller than about 80 degrees. The spacing between neighboring gate spacers 136 and 336 is S1, and the spacing between neighboring gate spacers 336 and 436 is S2. Spacing S1 may be equal to, or different from, spacing S2.

Figure 4A:
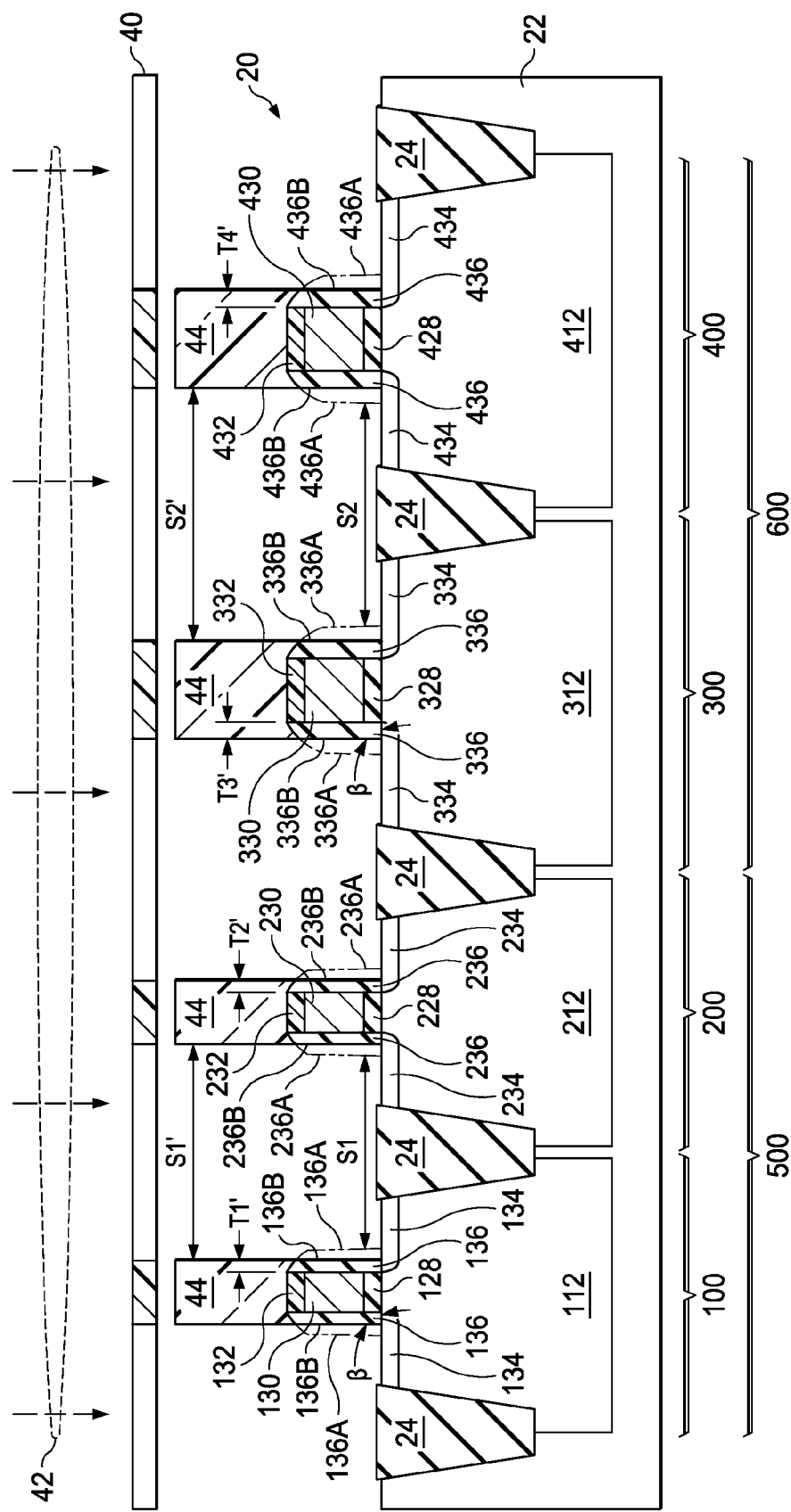
Figure 4B:
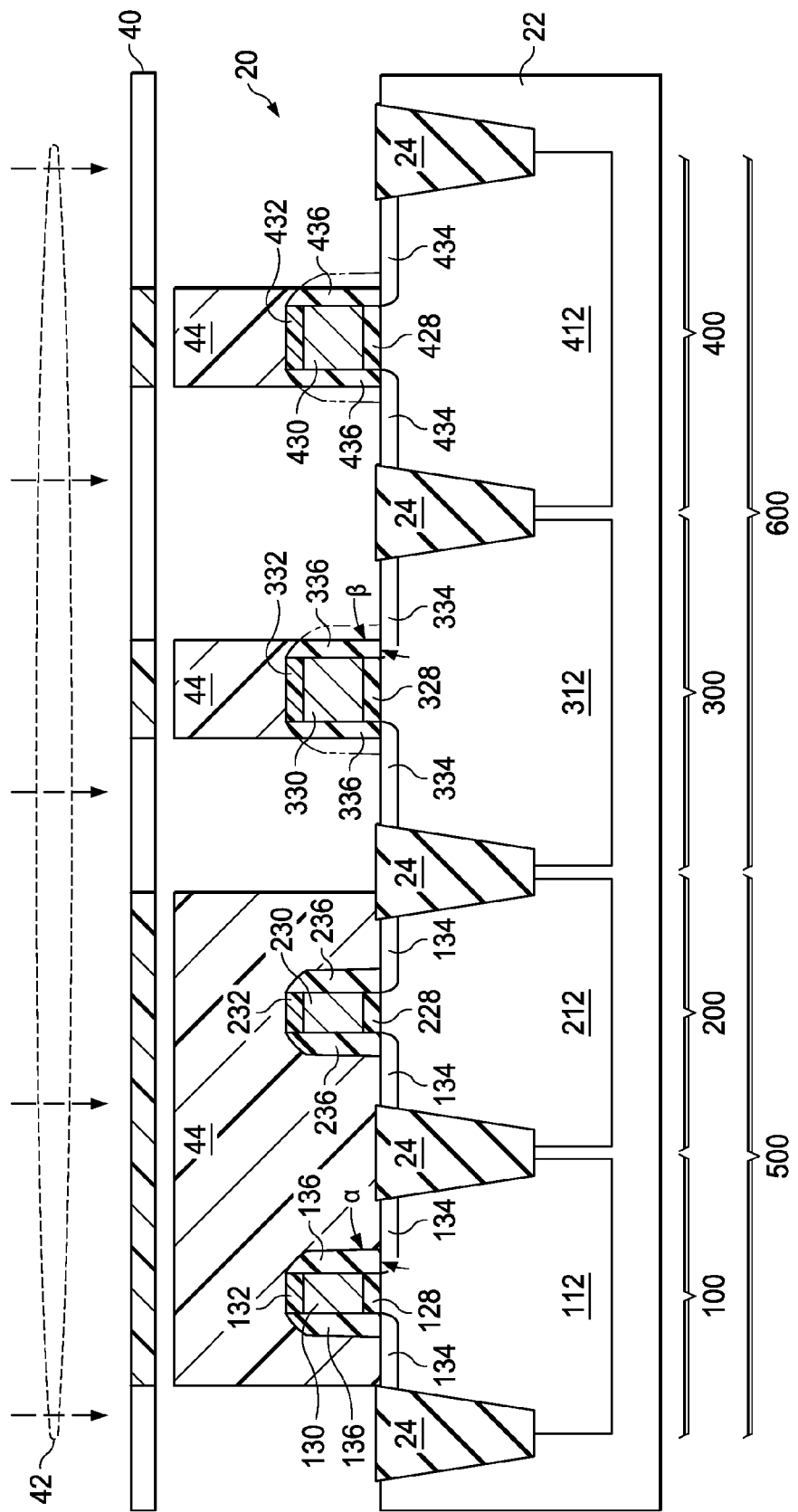

Referring to FIG. 4A or 4B, a patterning is performed to etch at least some, or all of, gate spacers 136, 236, 336, and 436. The respective process step is referred to as a gate-spacer-thinning step hereinafter. Some of gate spacers 136, 236, 336, and 436 may not be etched during the gate-spacer-thinning step. The gate-spacer-thinning step includes using lithography mask 40 to expose photoresist 44, wherein arrows 42 represents the light that is used for exposing photoresist 44. After the exposure, photoresist 44 is developed. The patterned photoresist 44 includes portions that cover gate stacks 126, 226, 326, and 426, and the inner portions of gate spacers 136, 236, 336, and 436. Some of the outer portions (which are illustrated using dashed lines) of gate spacers 136, 236, 336, and 436 are exposed, and are not covered by photoresist 44. The exposed outer portions of gate spacers 136, 236, 336, and 436 are then etched in an etching step. The etching is performed until portions of the substrate 22 that are overlapped by the exposed portion of gate spacers 136, 236, 336, and 436 are exposed. In some embodiments, the etching is an anisotropic etching. Accordingly, the sidewalls 136B, 236B, 336B, and 436B of the etched gate spacers 136, 236, 336, and 436 are substantially vertical, and the tilt angle β is greater than 85 degrees, and may be between 85 degrees and about 90 degrees. In FIG. 4A, all gate spacers 136, 236, 336, and 436 are thinned. In FIG. 4B, gate spacers 336 and 436 are thinned, and gate spacers 136 and 236 are not thinned.

As a result of the etching step, thicknesses T1, T2, T3, and T4 (FIG. 3) of gate spacers 136, 236, 336, and 436 are reduced to thicknesses T1', T2', T3', and T4' (FIG. 4A), respectively. In some embodiments, the differences (T1-T1'), (T2-T2'), (T3-T3'), and (T4-T4') may be greater than about 20 Å, and may be about 1030 Å or about 3050 Å. Furthermore, the ratios (T1-T1')/T1, (T2-T2')/T2, (T3-T3')/T3, and (T4-T4')/T4, which represent how many percents of gate spacers 136, 236, 336, and 436 are etched, may be in the range between (and including) 0 percent and about 20 percent, or between (and including) 0 percent and about 10 percent, wherein 0 percent represents that the respective gate spacers 136, 236, 336, and 436 are not etched during the gate-spacer-thinning step.

The gate-spacer-thinning step results in the spacing between neighboring gate spacers 126 and 236 to be increased from S1 to S1', and the spacing between neighboring gate spacers 326 and 436 to be increased from S2 to S2'. Accordingly, the areas of the subsequently formed strained layers 150, 250, 350, and 450 (FIG. 7) are increased. This results in the strain applied on the respective channel regions of MOS devices 160, 260, 360, and 460 (FIG. 7) to be increased. Furthermore, the magnitude of the increase in the strain is related to the differences (S1-S1') and (S2-S2'), and the greater differences (S1-S1') and (S2-S2') are, the greater the increase in the strain to the channel regions. Accordingly, by adjusting differences (S1-S1') and (S2-S2'), the increase in the strain is adjusted, and the performance (such as the drive currents) of MOS devices 160, 260, 360, and 460 (FIG. 7) is adjusted. Differences (S1-S1') and (S2-S2') may be equal to each other or different from each other. For example, by etching gate spacers 336 and 436 more than etching gate spacers 136 and 236, the increase in the performance of the MOS devices in device regions 300 and 400 is greater than the increase in the performance of the MOS devices in device regions 100 and 200.

In alternative embodiments, as shown in FIG. 4B, during the gate-spacer-thinning step, gate spacers 136 and 236 are not etched, while gate spacers 336 and 436 are etched. This may be performed when device regions 500 and 600 are the same type of device region, which device region is selected from the core device, the memory device region, the IO device region, and the like. Accordingly, even if MOS device regions 100, 200, 300, and 400 are of the same type of device regions, the performance of the respective device MOS devices formed therein may be adjusted differently.

In alternative embodiments, etching gate spacers 136 and 236 while not etching gate spacers 336 and 436 may also be performed when device regions 500 and 600 are different types of device regions.

Figure 5:
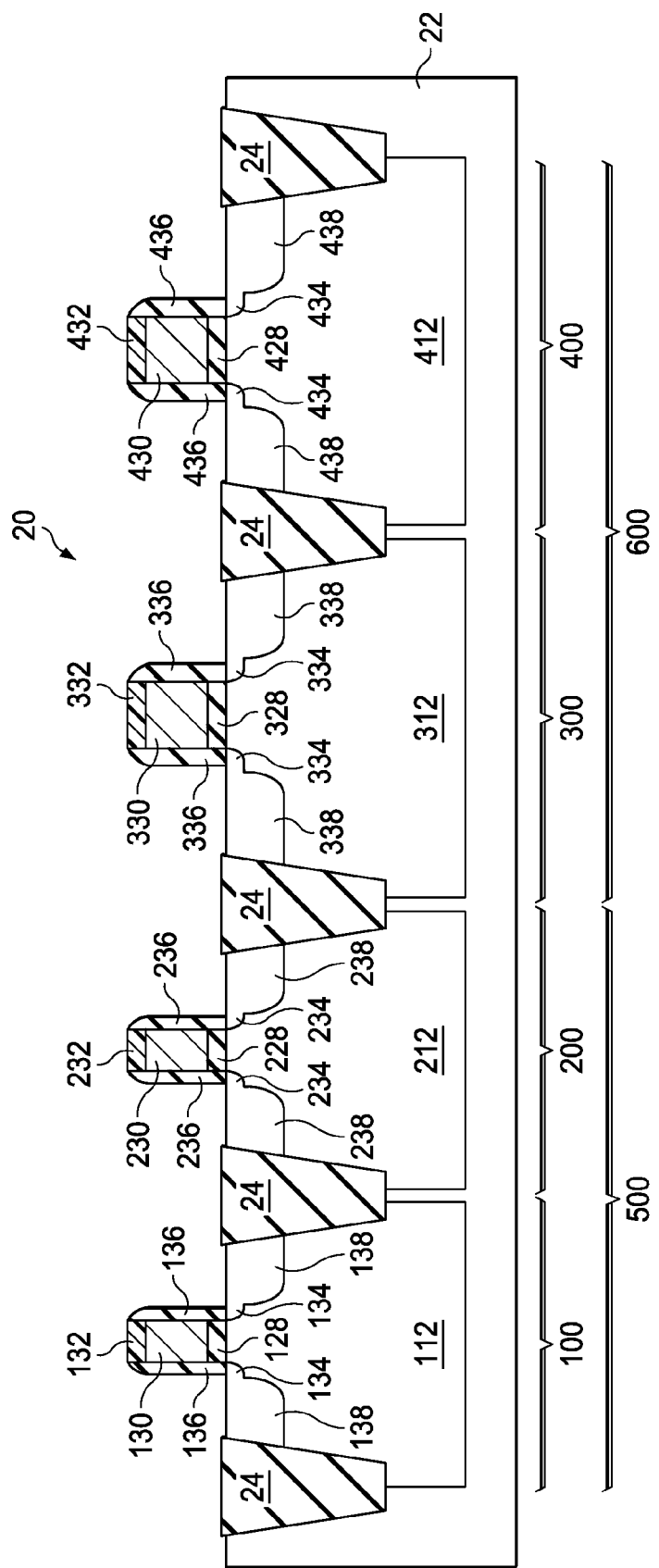

Referring to FIG. 5, source/drain regions 138, 238, 338, and 438 are formed in device regions 100, 200, 300, and 400, respectively. In some embodiments, the formation may be performed by implanting n-type impurities into device regions 100 and 300, and implanting p-type impurities into device regions 200 and 400. In the exemplary process shown in FIGS. 3 through 5, the formation of source/drain regions 138, 238, 338, and 438 are performed after the gate-spacer-thinning step (FIG. 4). In alternative embodiments, the formation of source/drain regions 138, 238, 338, and 438 are performed before the gate-spacer-thinning step (FIGS. 4A and 4B), and after the gate spacer formation step in FIG. 3.

Figure 6:
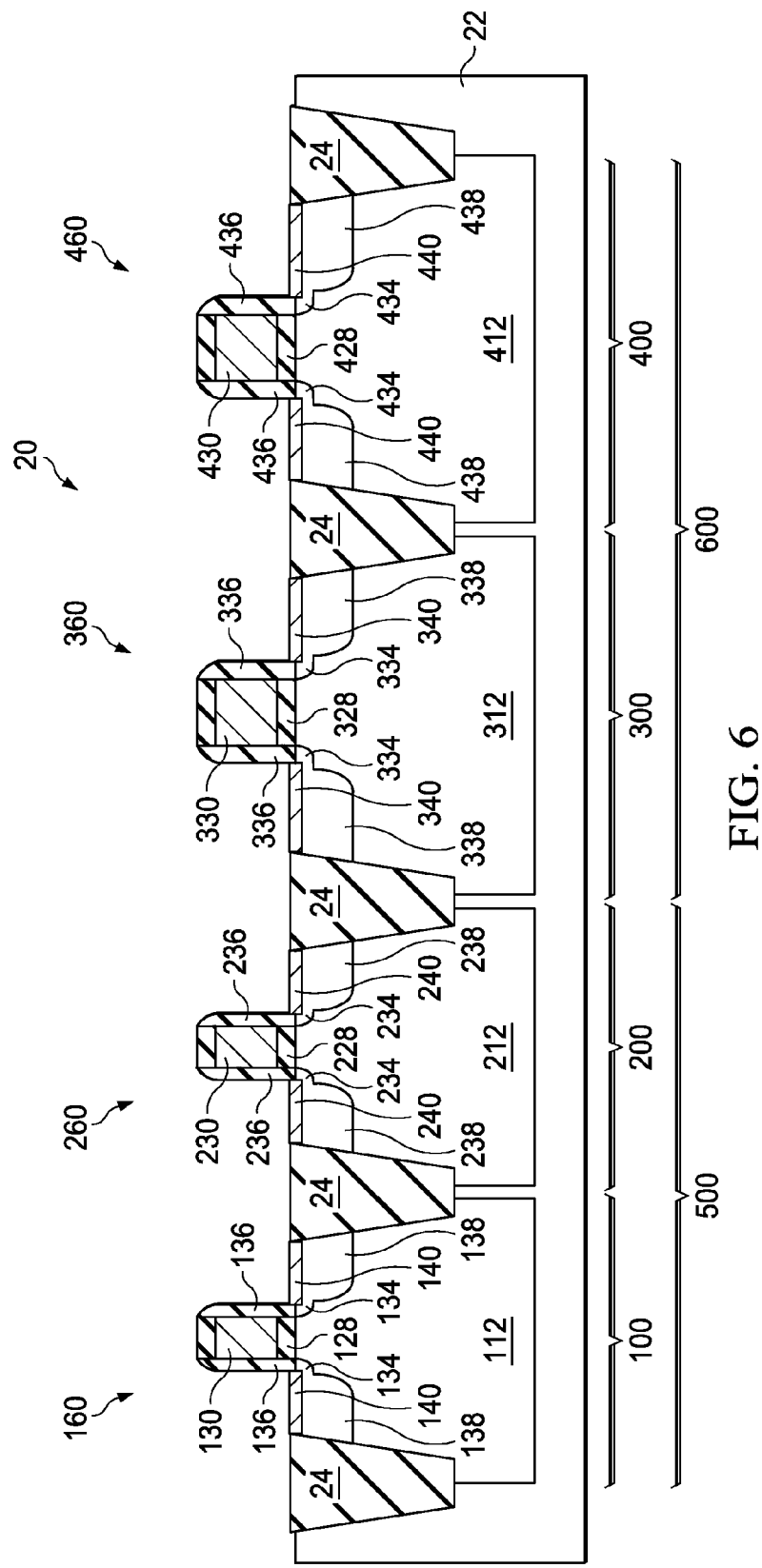

Hard masks 132, 232, 332, and 432 are then removed. The resulting structure is shown in FIG. 6. Next, silicide regions 140, 240, 340, and 440 are formed in device regions 100, 200, 300, and 400, respectively, for example, through a salicide process. In the salicide process, a metal layer is formed by depositing a layer of metal, such as cobalt, nickel, titanium, and the like, over wafer 20. Wafer 20 is then annealed to form silicide regions between the deposited metal and the underlying exposed silicon regions. Un-reacted metal is then removed. The MOS devices that are formed in FIG. 6 are denoted as MOS devices 160, 260, 360, and 460, which are in device regions 100, 200, 300, and 400, respectively.

Figure 7:
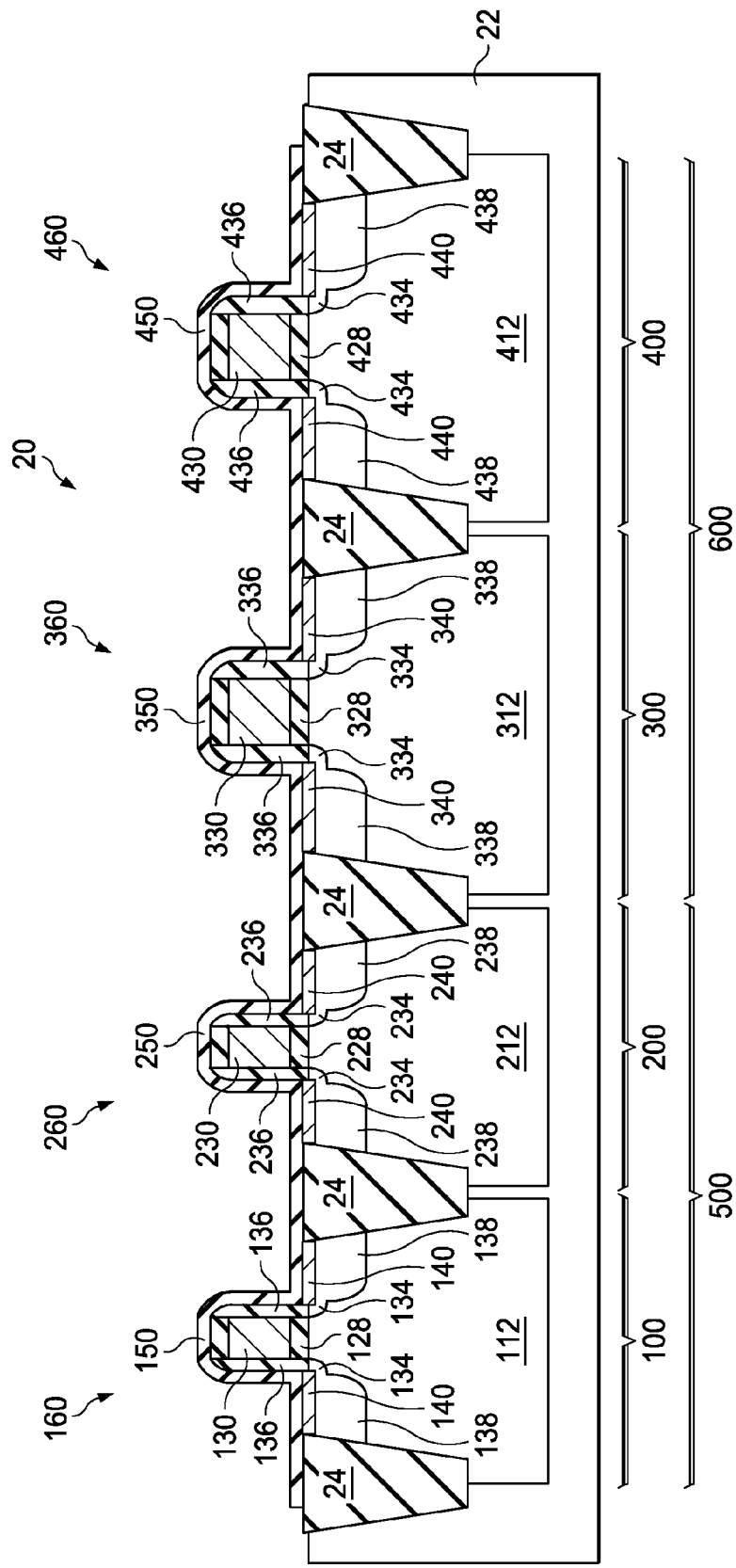

FIG. 7 illustrates a structure after the formation of strained layers 150, 250, 350, and 450. Strained layers 150 and 350 are tensile layers having inherent tensile stresses, and may be formed simultaneously. Strained layers 250 and 450 are compressive layers having inherent compressive stresses, and may be formed simultaneously. In some embodiments, strained layers 150, 250, 350, and 450 are Contact Etch Stop Layers (CESLs). Alternatively, strained layers 150, 250, 350, and 450 are other layers that do not perform the etch stop function. The materials of strained layers 150, 250, 350, and 450 include, and are not limited to, carbon-doped silicon oxide ($SiC_xO_y$), carbon-doped silicon nitride ($SiC_xN_y$), silicon nitride ($Si_xN_y$), silicon oxynitride ($SiO_xN_y$), and the like, wherein x and y represents values between 0 and 1.

Figure 8:
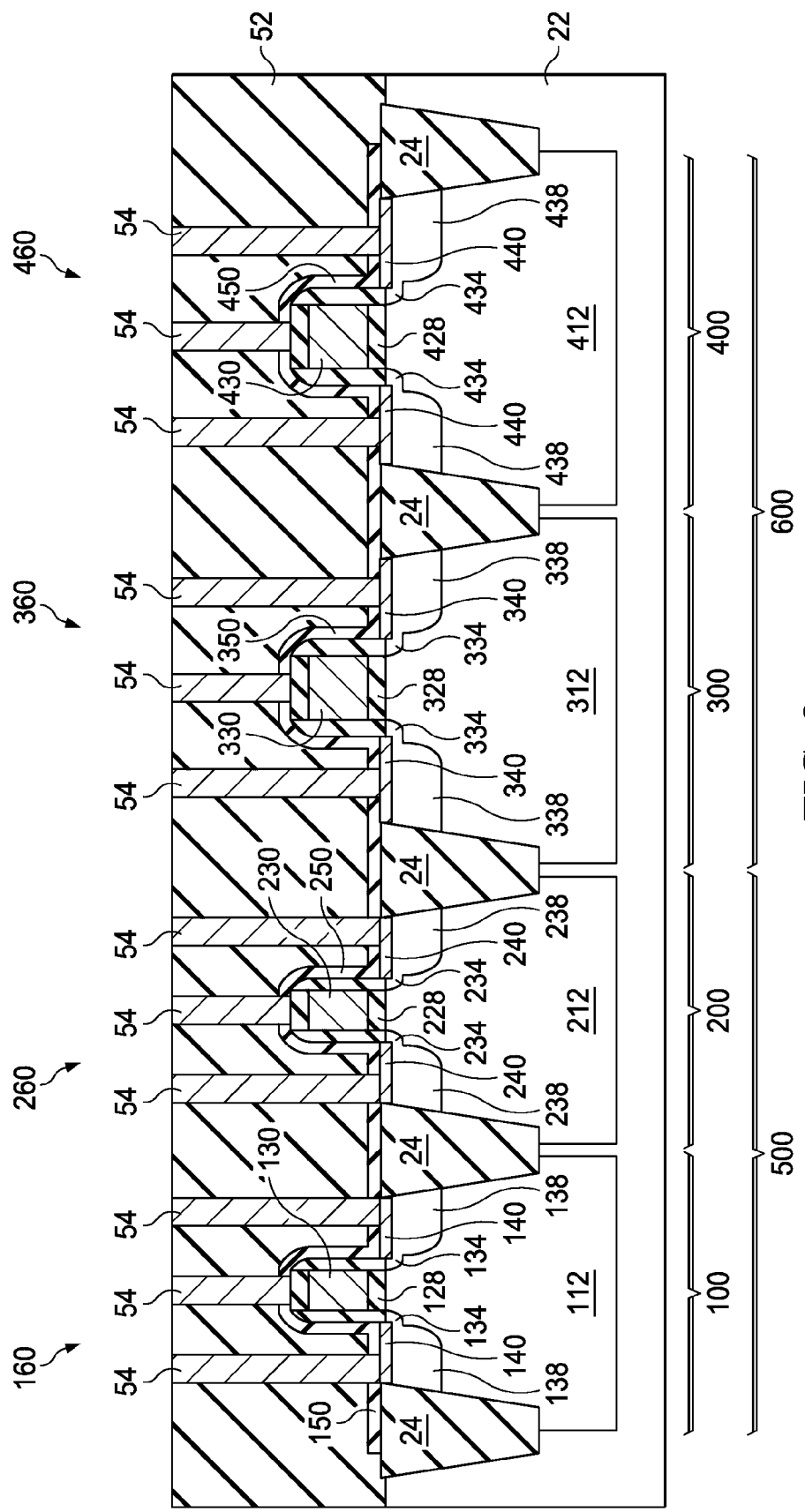

FIG. 8 illustrates the formation of Inter-Layer Dielectric (ILD) 52 and contact plugs 54. ILD 52 may be formed over, and may contact, strained layers 150, 250, 350, and 450. Contact plugs 54 are then formed, for example, by etching ILD 52 and strained layers 150, 250, 350, and 450 to form contact plug openings, and filling the contact openings with a conductive material such as tungsten. In the etching of ILD 52, strained layers 150, 250, 350, and 450 are used as CESLs.

In some embodiments, by adjusting the thicknesses of gate spacers 136, 236, 336, and 436, the sizes of the selected ones, or all of, strained layers 150, 250, 350, and 450 are increased. The strain applied to MOS devices 160, 260, 360, and 460 are adjusted, and hence the performance values such as the drive currents of MOS devices 160, 260, 360, and 460 are adjusted.

In accordance with embodiments, a method includes forming a gate stack over a semiconductor substrate, and forming a gate spacer on a sidewall of the gate stack. After the step of forming the gate spacer, the gate spacer is etched to reduce a thickness of the gate spacer. A strained layer is then formed. The strained layer includes a portion on an outer sidewall of the gate spacer, and a portion over the gate stack.

In accordance with other embodiments, a method includes forming a first, a second, a third, and a fourth gate stack over a semiconductor substrate, wherein the first, the second, the third, and the fourth gate stacks are portions of a first, a second, a third, and a fourth MOS device, respectively. A first, a second, a third, and a fourth gate spacer are formed on sidewalls of the first, the second, the third, and the fourth gate stacks, respectively, wherein the first and the second gate spacers are neighbors of each other, and wherein the third and the fourth gate spacers are neighbors of each other. After the step of forming the first, the second, the third, and the fourth gate spacers, outer portions of first and the second gate spacers are etched. Inner portions of the first and the second gate spacers closer to the respective first and the second gate stacks than the outer portions are not etched. A first and a second strained layer are formed over and contacting the first and the second gate spacers, respectively.

In accordance with yet other embodiments, a device includes a gate stack over a semiconductor substrate, and a gate spacer on a sidewall of the gate stack. An outer sidewall of the gate spacer has a tilt angle greater than 85 degrees. A source/drain region is in the semiconductor substrate and adjacent to the gate spacer. A strained layer is over the gate stack, the gate spacer, and the source/drain region.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   forming a gate stack over a semiconductor substrate;
   forming a gate spacer on a sidewall of the gate stack;
   implanting the semiconductor substrate to form a lightly doped drain/source region adjacent to the gate stack;
   after the gate spacer is formed and after the lightly doped drain/source region is formed, forming a source/drain region adjacent to the gate spacer;
   after the forming the source/drain region, etching the gate spacer to reduce a thickness of the gate spacer;
   forming an additional gate stack over the semiconductor substrate;
   forming an additional gate spacer on a sidewall of the additional gate stack;
   after the step of forming the additional gate spacer, etching the additional gate spacer to reduce a thickness of the additional gate spacer, wherein the etching the gate spacer and the etching the additional gate spacer are performed simultaneously, and wherein a remaining thickness of the gate spacer is different from a remaining thickness of the additional gate spacer; and
   forming a strained layer, wherein the strained layer comprises a portion on an outer sidewall of the gate spacer, and a portion over the gate stack.

2. The method of claim 1, wherein the step of etching the gate spacer comprises:
   forming a photo resist overlapping the gate stack and an inner portion of the gate spacer, wherein an outer portion of the gate spacer is exposed, and wherein the outer portion is farther away from the gate stack than the inner portion; and
   etching the outer portion of the gate spacer using the photo resist as an etching mask.

3. The method of claim 2, wherein the step of etching the gate spacer is performed until a portion of the semiconductor substrate overlapped by the outer portion of the gate spacer is exposed.

4. The method of claim 1, wherein the forming the source/drain region comprises implanting the semiconductor substrate.

5. The method of claim 1, wherein the gate stack and the additional gate stack are portions of a first and a second Metal-Oxide-Semiconductor (MOS) device, respectively, and wherein the first and the second MOS devices are different types of MOS devices selected from the group consisting essentially of a core MOS device, a memory MOS device, and an Input/Output (IO) MOS device.

6. A method comprising:

forming a first, a second, a third, and a fourth gate stack over a semiconductor substrate, wherein the first, the second, the third, and the fourth gate stacks are portions of a first, a second, a third, and a fourth Metal-Oxide-Semiconductor (MOS) device, respectively;

implanting the semiconductor substrate to form a first and a second lightly doped drain/source region adjacent to the first and the second gate stacks, respectively;

forming a first, a second, a third, and a fourth gate spacer on sidewalls of the first, the second, the third, and the fourth gate stacks, respectively, wherein the first and the second gate spacers are neighbors of each other, and wherein the third and the fourth gate spacers are neighbors of each other;

after the first, the second, the third, and the fourth gate spacers are formed, forming a first, a second, a third, and a fourth source/drain region adjacent to the first, the second, the third, and the fourth gate spacers, respectively;

after the step of forming the first and the second source/drain regions and after the first and the second lightly doped drain/source regions are formed, etching outer portions of first and the second gate spacers, wherein inner portions of the first and the second gate spacers closer to the respective first and the second gate stacks than the outer portions are not etched;

when the first and the second gate spacers are etched, etching the third and the fourth gate spacers to reduce thicknesses of the third and the fourth gate spacers, wherein remaining portions of the third and the fourth gate spacers have different thicknesses than remaining portions of the first and the second gate spacers; and forming a first and a second strained layer over and contacting the first and the second gate spacers, respectively.

7. The method of claim 6, wherein the first and the second MOS devices are of a same MOS device type as the third and the fourth MOS devices, and wherein the same MOS device type is selected from a core MOS device type, a memory MOS device type, and an Input/output (IO) MOS device type.

8. The method of claim 6, wherein the first and the second MOS devices are of a first MOS device type different from a second MOS device type of the third and the fourth MOS devices, and wherein the first and the second MOS device types are selected from a core MOS device type, a memory MOS device type, and an Input/output (IO) MOS device type.

9. The method of claim 6, wherein the first and the third MOS devices are of a same MOS device type selected from the group consisting essentially of a core MOS device, a memory MOS device, and an IO MOS device, and wherein when the first and the second gate spacer are etched, the third and the fourth gate spacers are not etched.

10. The method of claim 6, wherein before the step of etching the outer portions of first and the second gate spacers, a first spacing between the first and the second gate spacers is equal to a second spacing between the third and the fourth gate spacers, and wherein after the step of etching, a third spacing between the first and the second gate spacers is different from a fourth spacing between the third and the fourth gate spacers.

11. The method of claim 6, wherein the step of etching the first and the second gate spacers comprises:

forming a photo resist overlapping the first and the second gate stacks and inner portions of each of the first and the second gate spacers, wherein an outer portion of each of the first and the second gate spacers is exposed; and etching the outer portion of each of the first and the second gate spacers using the photo resist as an etching mask.

12. The method of claim 6, wherein the step of etching the first and the second gate spacers is performed until a portion of the semiconductor substrate overlapped by the outer portion of each of the first and the second gate spacers is exposed.

13. The method of claim 6, wherein forming the first and the second source/drain regions comprise implanting the semiconductor substrate.

14. A method comprising:

forming a first gate stack and a second gate stack over a semiconductor substrate;

forming a first gate spacer and a second gate spacer on a sidewall of the first gate stack and a sidewall of the second gate stack, respectively;

after the first gate spacer and the second gate spacer are formed, implanting the semiconductor substrate to form a first source/drain region and a second source/drain region adjacent to the first gate spacer and the second gate spacer, respectively; and after the forming the first source/drain region and the second source/drain region, etching the first gate spacer and the second gate spacer simultaneously, wherein the etched first gate spacer and the second gate spacer have different thicknesses after the etching.

15. The method of claim 14, wherein the etching the first gate spacer and the second gate spacer comprises:

forming a photo resist overlapping the first gate stack, the second gate spacer, an inner portion of the first gate spacer, and an inner portion of the second gate spacer, wherein an outer portion of the first gate spacer and an outer portion of the second gate spacer are exposed; and etching the outer portion of the first gate spacer and the outer portion of the second gate spacer using the photo resist as an etching mask.

16. The method of claim 15, wherein the etching the outer portion of the first gate spacer is performed until a portion of the semiconductor substrate overlapped by the outer portion of the first gate spacer is exposed.

17. The method of claim 1, wherein the etching the gate spacer to reduce the thickness of the gate spacer is anisotropic.

18. The method of claim 6, wherein the etching outer portions of the first and the second gate spacers is anisotropic.

19. The method of claim 14, wherein the etching the first gate spacer is anisotropic.

* * * * *